United States Patent
Elad et al.

(10) Patent No.: US 10,812,154 B1
(45) Date of Patent: Oct. 20, 2020

(54) MIMO RADAR WITH RECEIVE ANTENNA MULTIPLEXING

(71) Applicant: SEMICONDUCTOR COMPONENTS INDUSTRIES, LLC, Phoenix, AZ (US)

(72) Inventors: Danny Elad, Kibutz Matzuva (IL); Tom Heller, Karmiel (IL); Oded Katz, Ganei-Tikva (IL)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/801,406

(22) Filed: Feb. 26, 2020

Related U.S. Application Data

(60) Provisional application No. 62/924,309, filed on Oct. 22, 2019.

(51) Int. Cl.
*H04B 7/04* (2017.01)
*H04B 7/0413* (2017.01)
(Continued)

(52) U.S. Cl.
CPC .......... *H04B 7/0413* (2013.01); *G01S 13/003* (2013.01); *H03M 1/001* (2013.01)

(58) Field of Classification Search
CPC .. H04B 7/0413; H04B 7/0408; H04B 7/0897; H04B 7/0452; H04B 1/38; H04B 7/04;
(Continued)

(56) References Cited

U.S. PATENT DOCUMENTS 7,573,398 B2 *  8/2009  Hoctor ................. A61B 5/0006
                                              340/870.06
9,144,012 B2 *  9/2015  Brobston ................. H04B 1/28
(Continued)

FOREIGN PATENT DOCUMENTS

| EP | 2463683 A1 | 6/2012 |
|---|---|---|
| EP | 3339892 A1 | 6/2018 |
| GB | 2443456 A | 5/2008 |

OTHER PUBLICATIONS

Sandeep Rao, "MIMO Radar," Texas Instruments Application Report, SWRA554A, May 2017, Rev. Jul. 2018, 13 pages.

*Primary Examiner* — Rahel Guarino
(74) *Attorney, Agent, or Firm* — Ramey & Schwaller, LLP

(57) ABSTRACT

A multi-antenna signal encoding method comprises receiving an antenna signal and a reference signal a first mixer; producing, using the first mixer, a down-converted signal based on the antenna signal and the reference signal; receiving, at one or more second mixers, second antenna signals and second reference signals orthogonal to the first reference signal; producing one or more second down-converted signals based on the one or more second antenna signals and the one or more second reference signals; converting, using an analog-to-digital converter, a summation signal corresponding to a sum of the first down-converted signal and the one or more second down-converted signals, into a digital receive-signal; and extracting, at a processor, a plurality of digital signals from the digital receive-signal, wherein each of the plurality of digital signals corresponds to one of the first antenna signal and the one or more second antenna signals.

17 Claims, 10 Drawing Sheets

(51) Int. Cl.
*H03M 1/00* (2006.01)
*G01S 13/00* (2006.01)

(58) Field of Classification Search
CPC ...... H04B 7/0697; H04B 10/40; H04B 15/06; H04B 1/403; H04B 1/44; H04B 1/50; H04L 5/0007; G01S 13/87; G01S 2013/0254; H04J 13/0003; H04J 11/00; H03M 1/00; H03M 1/12; H03M 13/6569; H03M 1/124
See application file for complete search history.

(56) References Cited

U.S. PATENT DOCUMENTS

| | | |
|---|---|---|
| 2013/0342387 A1 | 12/2013 | Zwick et al. |
| 2014/0347211 A1 | 11/2014 | Schoor et al. |
| 2016/0003939 A1 | 1/2016 | Stainvas Olshansky et al. |
| 2016/0131752 A1 | 5/2016 | Jansen et al. |
| 2018/0159246 A1 | 6/2018 | Raphaeli et al. |
| 2018/0359018 A1* | 12/2018 | Ling ................ H04B 7/086 |
| 2019/0049577 A1 | 2/2019 | Iida et al. |
| 2019/0207322 A1 | 7/2019 | Ding |
| 2019/0219683 A1 | 7/2019 | Fang |
| 2019/0235050 A1 | 8/2019 | Maligerogos et al. |

\* cited by examiner

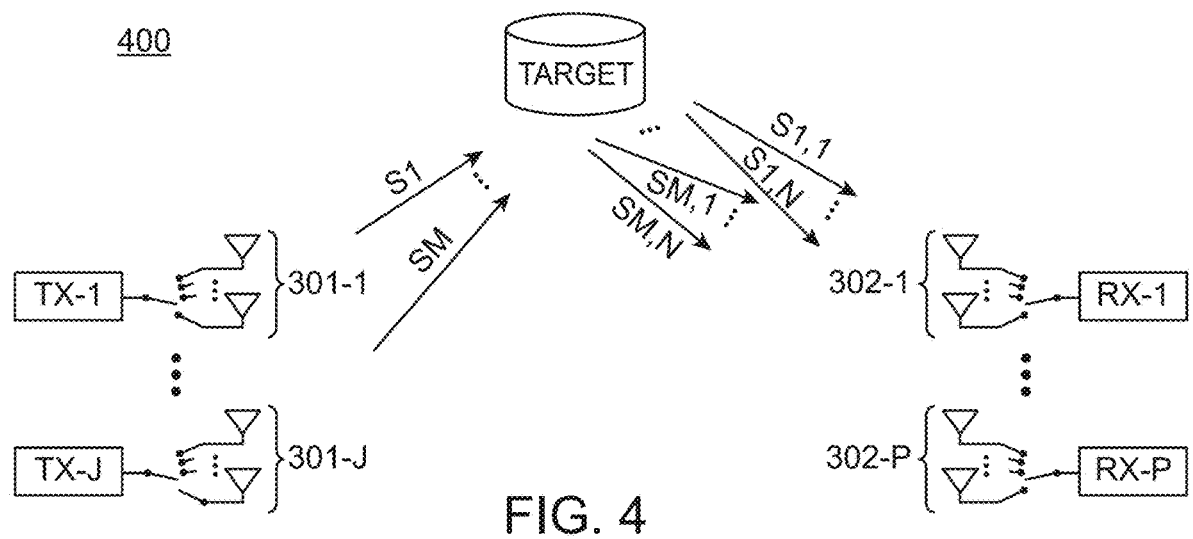
FIG. 4
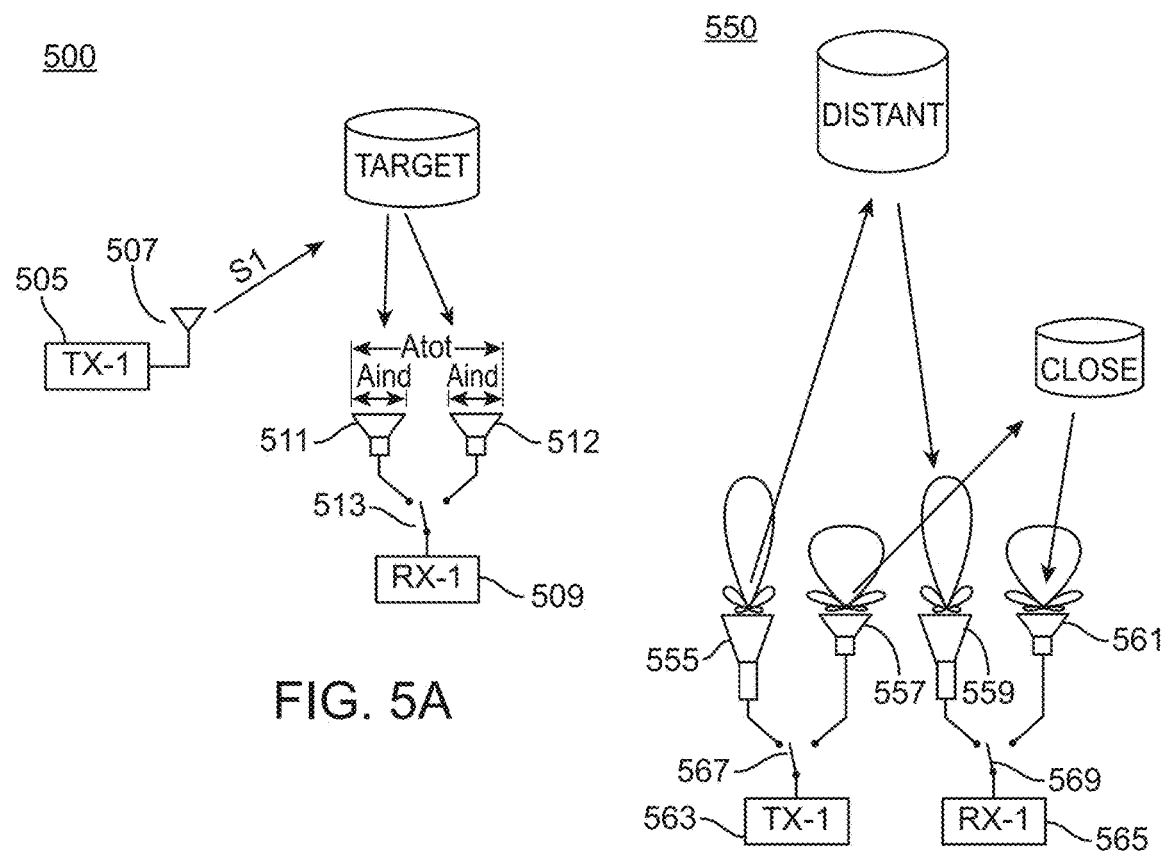
FIG. 5A
FIG. 5B

MIMO RADAR WITH RECEIVE ANTENNA MULTIPLEXING

CROSS-REFERENCE TO RELATED APPLICATIONS

The present application claims priority benefit of U.S. Patent App. 62/924,309 filed 2019 Oct. 22 and titled "MIMO Radar with Receive Antenna Multiplexing" by inventors Danny Elad, Oded Katz, and Tom Heller. The present application relates to U.S. patent application Ser. No. 16/203,149, filed 2018 Nov. 28 and titled "Reconfigurable MIMO radar" by inventors Danny Elad, Ofer Markish, and Benny Sheinman. The present application further relates to U.S. patent application Ser. No. 16/583,663, filed 2019 Sep. 26 and titled "Multi-input downconversion mixer" by inventor Benny Sheinman. Each of the foregoing applications is entirely incorporated by reference herein.

BACKGROUND

In the quest for ever-safer and more convenient transportation options, many car manufacturers are developing self-driving cars which require an impressive number and variety of sensors, often including arrays of acoustic and/or electromagnetic sensors to monitor the distance between the car and any nearby persons, pets, vehicles, or obstacles. Among the contemplated sensing technologies are multi-input, multi-output radar systems, though it can be cost-prohibitive to provide a sufficient number of transmitters and receivers for an adequately performing antenna array. The prior art fails to offer a satisfactory solution to this dilemma.

SUMMARY

The shortcomings identified above may be addressed at least in part by multi-input downconversion mixers, systems, and methods with receive antenna multiplexing.

A receiver architecture is disclosed which can support many different code-division multiplexing strategies. There are codes available in the open literature with different properties which are suitable for different applications. For example, in a naïve scenario in which the waveforms emitted by the different transmitters are not modulated, each of the signals received by an antenna are modulated by a corresponding code waveform before being combined, sampled, and demodulated. In a scenario where the received signals are already modulated with information about their parent transmitter, a second layer of coding may be applied to the received signals. This can be achieved, for example, by applying slower modulation on top of a higher-frequency cyclic code.

In at least one example, a receiver architecture includes a pair of down-conversion mixers LO-modulated to distinctly mark each of the signals received by an associated pair of receive antennas, and a demodulator which separates the received signals in a digital signal processor (DSP) after the combined signal is sampled.

In accordance with an example of this disclosure, a multi-antenna signal encoding method comprises: receiving a first antenna signal and a first reference signal at a first mixer; producing, using the first mixer, a first down-converted signal based on the first antenna signal and the first reference signal; receiving, at one or more second mixers, one or more second antenna signals and one or more second reference signals orthogonal to the first reference signal; producing, using the one or more second mixers, one or more second down-converted signals based on the one or more second antenna signals and the one or more second reference signals; converting, using an analog-to-digital converter, a summation signal corresponding to a sum of the first down-converted signal and the one or more second down-converted signals, into a digital receive-signal; and extracting, at a processor, a plurality of digital signals from the digital receive-signal, wherein each of the plurality of digital signals corresponds to one of the first antenna signal and the one or more second antenna signals.

In accordance with another example of this disclosure, a non-transitory computer readable medium stores instructions executable by a processor, the instructions comprising instructions to: receive, using a first mixer, a first antenna signal and a first reference signal; produce, using the first mixer, a first down-converted signal based on the first antenna signal and the first reference signal; receive, using one or more second mixers, one or more second antenna signals and one or more second reference signals orthogonal to the first reference signal; produce, using the one or more second mixers, one or more second down-converted signals based on the one or more second antenna signals and the one or more second reference signals; receive, at the processor, a digital receive-signal from an analog-to-digital converter, the digital receive-signal corresponding to a sum of the first down-converted signal and the one or more second down-converted signals, into a digital receive-signal; and extract a plurality of digital signals from the digital receive-signal, wherein each of the plurality of digital signals corresponds to one of the first antenna signal and the one or more second antenna signals.

BRIEF DESCRIPTION OF THE DRAWINGS

FIG. 4 is a schematic of an illustrative reconfigurable MIMO radar system.

FIG. 5A is a schematic of one reconfigurable MIMO system application.

FIG. 5B is a schematic of a second reconfigurable MIMO system application.

The drawings and corresponding detailed description are provided for explanatory purposes, not to limit the disclosure. To the contrary, they provide the foundation for understanding all modifications, equivalents, and alternatives falling within the scope of the appended claims.

DETAILED DESCRIPTION

Figure 1:
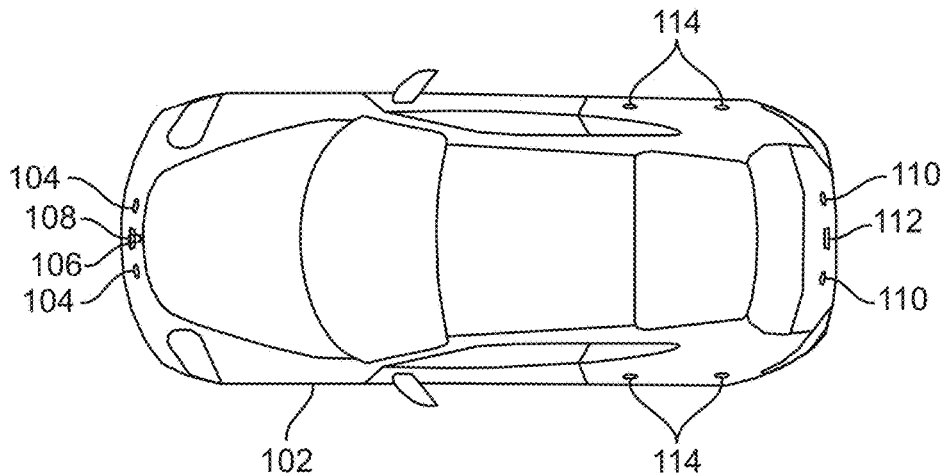
FIG. 1 is an overhead view of an illustrative vehicle equipped with sensors.

FIG. 1 shows an illustrative vehicle 102 equipped with an array of radar antennas, including antennas 104 for short range sensing (e.g., for park assist), antennas 106 for mid-range sensing (e.g., for monitoring stop and go traffic and cut-in events), antennas 108 for long range sensing (e.g., for adaptive cruise control and collision warning), each of which may be placed behind the front bumper cover. Antennas 110 for short range sensing (e.g., for back-up assist) and antennas 112 for midrange sensing (e.g., for rear collision warning) may be placed behind the cover of the rear bumper. Antennas 114 for short range sensing (e.g., for blind spot monitoring and side obstacle detection) may be placed behind the car fenders. Each set of antennas may perform multiple-input multiple-output (MIMO) radar sensing. The type, number, and configuration of sensors in the sensor arrangement for vehicles having driver-assist and self-driving features varies. The vehicle may employ the sensor arrangement for detecting and measuring distances/directions to objects in the various detection zones to enable the vehicle to navigate while avoiding other vehicles and obstacles.

Figure 2:
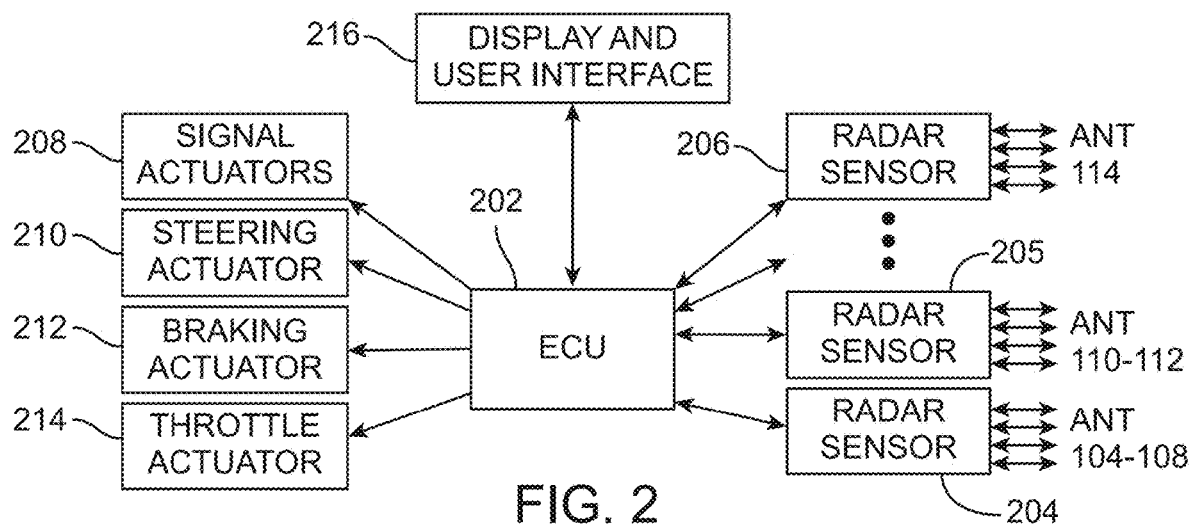
FIG. 2 is a block diagram of an illustrative driver-assistance system.

FIG. 2 shows an electronic control unit (ECU) 202 of a vehicle (e.g., 102) coupled to the various radar sensors 204-206 as the center of a star topology. Of course, other topologies including serial, parallel, and hierarchical (tree) topologies, are also suitable and contemplated for use in accordance with the principles disclosed herein. The radar sensors each include a radio frequency (RF) front end which couples to some of the transmit and receive antennas 104-114 to transmit electromagnetic waves, receive reflections, and determine a spatial relationship of the vehicle to its surroundings. To provide automated parking assistance, the ECU 202 may further connect to a set of actuators such as a turn-signal actuator 208, a steering actuator 210, a braking actuator 212, and throttle actuator 214. ECU 202 may further couple to a user-interactive interface 216 to accept user input and provide a display of the various measurements and system status.

Using the interface, sensors, and actuators, ECU 202 may provide automated parking, assisted parking, lane-change assistance, obstacle and blind-spot detection, autonomous driving, and other desirable features. In an automobile, the various sensor measurements are acquired by one or more electronic control units (ECU), and may be used by the ECU to determine the automobile's status. The ECU may further act on the status and incoming information to actuate various signaling and control transducers to adjust and maintain the automobile's operation. Among the operations that may be provided by the ECU are various driver-assist features including automatic parking, lane following, automatic braking, and self-driving.

To gather the necessary measurements, the ECU may employ a MIMO radar system. Radar systems operate by emitting electromagnetic waves which travel outward from the transmit antenna before being reflected back to a receive antenna. The reflector can be any moderately reflective object in the path of the emitted electromagnetic waves. By measuring the travel time of the electromagnetic waves from the transmit antenna to the reflector and back to the receive antenna, the radar system can determine the distance to the reflector. If multiple transmit or receive antennas are used, or if multiple measurements are made at different positions, the radar system can determine the direction to the reflector and hence track the location of the reflector relative to the vehicle. With more sophisticated processing, multiple reflectors can be tracked. At least some radar systems employ array processing to "scan" a directional beam of electromagnetic waves and construct an image of the vehicle's surroundings. Both pulsed and continuous-wave implementations of radar systems can be implemented, though frequency modulated continuous wave radar systems are generally preferred for accuracy.

Figure 3:
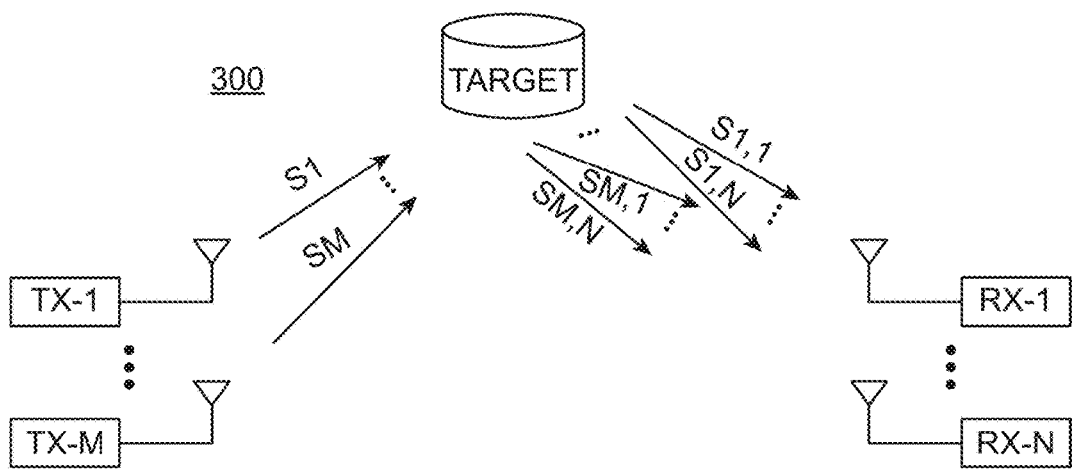
FIG. 3 is a schematic of an illustrative fixed multi-input, multi-output (MIMO) radar system.

FIG. 3 shows an illustrative system 300 having a fixed MIMO configuration, in which M transmitters are coupled to M transmit antennas to concurrently send M transmit signals. The M signals may variously reflect from one or more targets to be received by N receive antennas coupled to N receivers. Each receiver may extract the amplitude and phase, or travel delay associated with each of the M transmit signals, thereby enabling the system to concurrently obtain N*M measurements. Often the measurements need not be acquired concurrently. Further, the processing requirements associated with each receiver extracting M measurements can be reduced via the use of time division multiplexing and/or orthogonal coding. Regardless, fixed MIMO systems employ a respective antenna for each transmitter or receiver.

However, the greater the number of antennas, the greater the diversity of the system (e.g., the greater the number of independent measurements that the system can acquire and use for image formation).

FIG. 4 shows an illustrative reconfigurable MIMO radar system 400 in which M transmit antennas can each be selectively coupled to one of J<M transmitters, and N receive antennas can each be selectively coupled to P<N receivers, enabling N*M measurements to be obtained by only J transmitters and P receivers, thereby maintaining measurement diversity of the system while significantly reducing the system's size and cost. In at least one example of this disclosure, the number of transmitters and receivers may be maintained while increasing the number of antennas to significantly improve the performance of the system without substantially increasing the system's cost. The available antennas are systematically multiplexed to the available transmitters and receivers to collect the full set of measurements for radar imaging.

As shown in FIG. 5A, a reconfigurable MIMO system 500 (e.g., 400) can operate to improve the spatial resolution of radar and imaging systems while keeping the silicon area small and the power consumption low. Each transmitter and receiver is sequentially connected to each of the available antennas, and the measurements are digitally combined for image formation having improved spatial resolution. The illustrated system 500 includes a single transmitter 505 with a single transmit antenna 507 and a single receiver 509 with two selectable receiving antennas 511, 512. Selecting between the antennas 511, 512 is performed using a switch 513. Other selection methods are possible in accordance with this disclosure.

By receiving the signal from the first antenna 511 and then switching to the other antenna 512, the total aperture ($A_{tot}$) of the receiver 509, becomes larger than the aperture ($A_{ind}$) of the individual antennas 511, 512. Since image resolution is inversely proportional to the antenna aperture (large aperture generates narrow beam width), the resolution increases after suitable post processing. In contrast, a fixed MIMO system would require two receivers to be connected to the two receiving antennas in order to achieve the same resolution. Therefore, the reconfigurable MIMO approach (e.g., 500) provides increased resolution while keeping the power consumption low. In addition, since only a single receiver is used, the size of the chip that usually used to implement the receiver can be smaller and the system cost can be reduced.

As shown in FIG. 5B, a reconfigurable MIMO system 550 can operate to improve the range detection capabilities. To cover different detection ranges, transmitters can be switched between transmit antennas 555 having narrow beam widths and transmit antennas 557 having wide beam widths or antennas which are tuned to different frequency bands, and the receivers can be similarly switched between antennas 559 having narrow and antennas 561 having wide beam widths, or antennas which are tuned to different frequency bands. Alternatively, different transmitters can be connected to different antennas having narrow and wide beam widths, or to different antennas which are tuned to different frequency bands. The wide beam width antennas offer a wide field of view with better sensitivity to nearby targets but lack the range to detect distant targets. Conversely, narrow bandwidth antennas offer greater range for detecting distant targets but with their narrow field of view they may fail to detect nearby targets outside the narrow beam. Radar waveforms at higher frequencies yield better angular resolution than radar waveforms at lower frequencies, but incur higher path loss. The reconfigurable MIMO system may switch between the antennas systematically or as needed, thereby obtaining improved range detection capabilities beyond what would otherwise be currently feasible.

The system 550 illustrated in FIG. 5B includes a single transmitter 563 with two different transmitting antennas 555, 557 and a single receiver 565 with two different receiving antennas 559, 561. Selecting between the antennas is performed using a switch 567, 569. Other selection methods are possible as well. A fixed MIMO solution would require two transmitters and two receivers to achieve the same dual-range capabilities. Therefore, the reconfigurable MIMO approach (e.g., 550) improves the imaging radar range capabilities while reducing the number of transmitters and receivers.

To enable each of the receivers to determine their responses to each of the antennas, some form of transmit multiplexing may be employed so that the receivers can separate out the contributions from each transmitter. Preferably, the transmissions are in some sense "orthogonal" to simplify processing on the receive side. As compared with a system having a single transmitter, the radar spatial resolution can be improved by transmitting orthogonal waveforms from multiple transmitters, so long as the radar is capable of separating the waveforms upon reception in order to correlate a waveform measurement with its associated transmitter. The spatial resolution of an MIMO radar with $N_{TX}$ transmitters and $N_{RX}$ receivers is equivalent to the spatial resolution of a single-transmitter radar with $N_{TX} \times N_{RX}$ receivers. Thus, the MIMO radar has a virtual aperture width D of $s \times (N_{TX}N_{RX}-1)$, where s is the inter-antenna spacing. For $s=\lambda/2$, the effective beam width (in radians) is approximately $\lambda/D$, which becomes narrower as the number of elements is increased. The incentive for using MIMO radar techniques is therefore hardware efficiency. A 1 transmitter (TX)-8 receiver (RX) radar has the same spatial resolution as a 2RX-4RX radar.

There are different ways to achieve waveform orthogonality, for example: Time division multiplexing (TDM), Code division multiple access (CDMA), and Frequency division multiplexing (FDM). (This list is not exhaustive.) For TDM, only one transmitter transmits at a given time. For CDMA, each transmitter may operate concurrently, but transmits a waveform that is modulated by a code that is orthogonal to the codes that modulate the waveforms emitted by other transmitters. The waveforms are demodulated and separated upon reception. For FDM, each transmitter may operate concurrently, but transmits a waveform at a different frequency than that of the other transmitters.

Figure 6A:
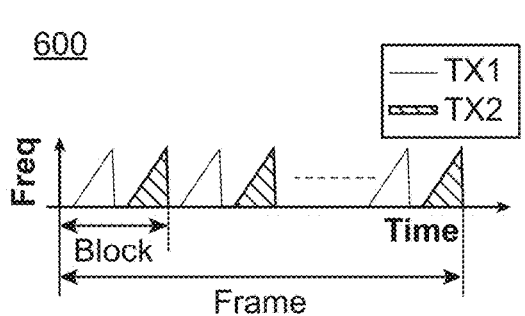
FIG. 6A is a graph of an illustrative time-division multiplexing approach for a multi-output radar.

FIG. 6A is a graph of an illustrative time-division multiplexing approach 600 for a multi-output radar. As illustrated in FIG. 6A, each frame consists of several blocks, with each block consisting of $N_{TX}$ time slots each corresponding to transmission by one of the $N_{TX}$ TX antennas (see e.g., FIG. 4, FIG. 5A, FIG. 5B). In FIG. 6A, for an FMCW radar with $N_{TX}=2$, alternate time slots are dedicated to TX1 and TX2. In at least one processing scheme of this disclosure for TDM-MIMO FMCW radar, the 2D-FFT (range-Doppler FFT) is performed for each TX-RX pair.

Figure 6B:
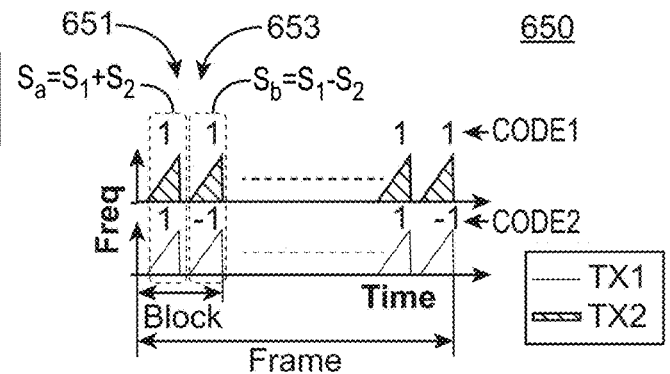
FIG. 6B is a graph of an illustrative code-division multiplexing approach for a multi-output radar.

FIG. 6B is a graph of an illustrative code-division multiplexing solution 650 for a multi-output radar. As illustrated in FIG. 6B, a frame consists of multiple blocks, each block consisting of $N_{TX}$ consecutive transmissions. In the illustrated multiplexing solution 650 all N-rx antennas are active in each of the $N_{TX}$ time slots of every block. For each block, the transmissions from multiple TX antennas are encoded with a spatial code (using BPM), which allows the received data to be subsequently sorted by each transmitter TX. FIG. 6B shows the solution 650 for the case of NTX=2, in which S1 is a chirp signal from transmitter TX1 and S2 is a chirp signal from transmitter TX2. The first slot 651 in a block transmits a combined signal of Sa=S1 plus S2. The second slot 653 in a block transmits a combined signal of Sb=S1 minus S2. Using the corresponding received signals (Sa and Sb) at a specific received RX antenna, the components from the individual transmitters (e.g., TX1, TX2) can be extracted in accordance with the following equations: S1=(Sa+Sb)/2 (equation no. 1) and S2=(Sa−Sb)/2 (equation no. 2).

Figure 7A:
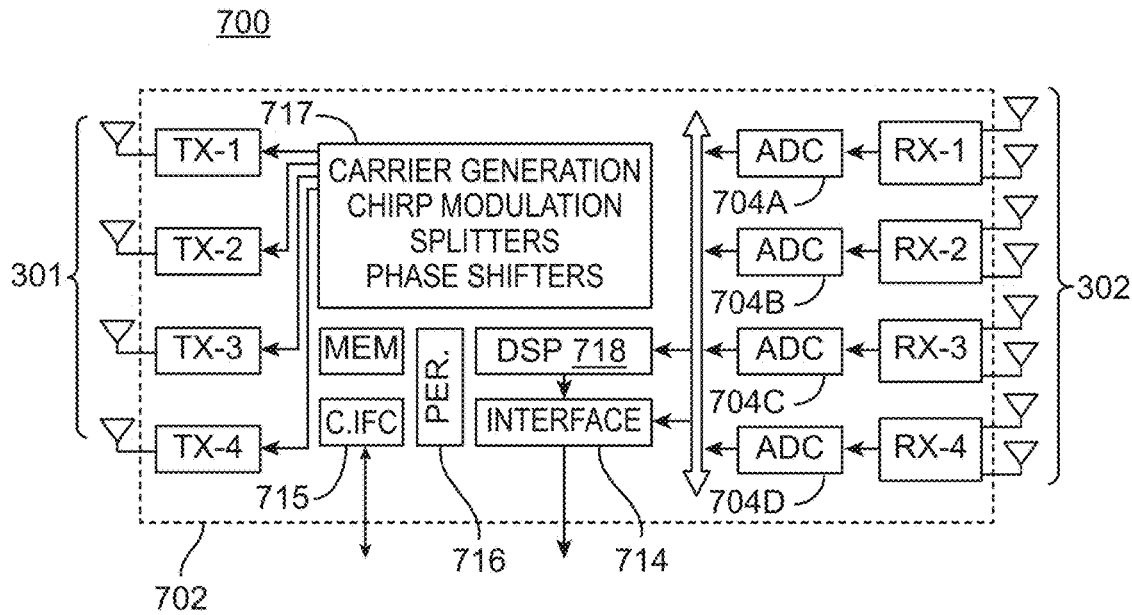
FIG. 7A is a block diagram of an illustrative MIMO radar transceiver chip.

FIG. 7A shows a block diagram 700 of an illustrative RF front end chip 702 having transceivers configured for a reconfigurable MIMO system (e.g., 400, 500, 550). The chip 702 includes four receivers (RX-1 through RX-4) each of which is selectably coupled to two receive antennas 302, providing a reconfigurable MIMO system with eight receive antennas, four of which can be employed concurrently to collect measurements. Four analog-to-digital converters (ADCs) 704A-704D sample and digitize the baseband receive signals from the receivers RX-1 through RX-4, supplying the digitized signals to a digital signal processor (DSP) 718 for filtering and processing, or directly to a high-bandwidth interface 714 to enable off-chip processing of the digitized baseband signals. If used, the DSP 718 generates image data that can be conveyed to an ECU (e.g., 202) via the high-bandwidth interface 714.

A control interface 715 enables the ECU (202) or other host processor to configure the operation of the RF front end chip 702, including the test and calibration peripheral circuits 716 and the transmit signal generation circuitry 717. Circuitry 717 generates a carrier signal within a programmable frequency band, with a programmable chirp rate and range. Splitters and phase shifters enable the multiple transmitters TX-1 through TX-4 to operate concurrently if desired. In the illustrated example, the RF front end chip 702 includes four transmitters (TX-1 through TX-4) each of which is coupled to a corresponding transmit antenna 301. In alternative examples, multiple transmit antennas are selectably coupled to each of the transmitters.

In accordance with some examples of this disclosure, the time required to repeat measurements with different combinations of transmit and receive antennas may be minimized by performing antenna switching during ongoing signal transmission. For example, while a transmitter is sending a transmit signal from a selected antenna, each receiver may acquire a first measurement with a first selected antenna and then, while the waveform transmission continues, switch to a second selected antenna to collect a second measurement. Additionally, or alternatively, while the transmitter is sending a transmit waveform via a first selected antenna, the transmitter may switch to a second selected antenna, enabling each receiver to obtain measurements responsive to the use of each transmit antenna.

Figure 7B:
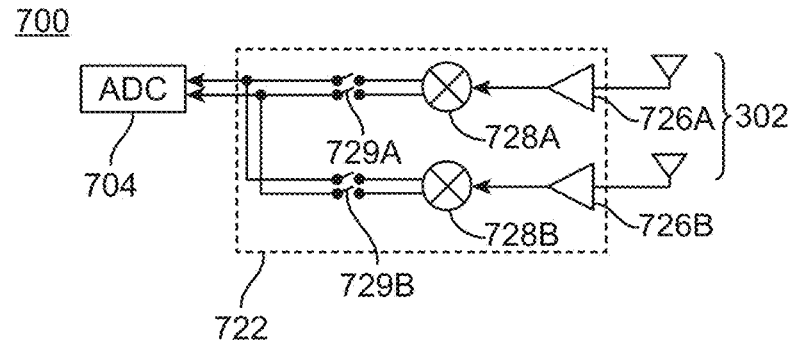
FIG. 7B is a schematic of an illustrative configuration for an antenna-switching receiver.

FIG. 7B shows an illustrative example of a receiver in the form of a multi-input downconversion mixer 722 that couples a selectable one or more of the multiple receiver antennas 302 to an ADC 704. The mixer 722 includes a separate connection terminal for each receive antenna 302. Each of the terminals is optionally coupled to a low noise amplifier (LNA) 726A, 726B. The LNAs 726 amplify the receive signal from the corresponding antenna to improve the received signal strength but are not essential. The output of each LNA 726A, 726B is coupled to a corresponding signal multiplier 728A, 728B, which multiplies the amplified receive signal with a reference signal to downconvert the amplified receive signal to an intermediate frequency or baseband, in differential form. The reference signal may be, e.g., a carrier signal, a frequency-modulated carrier signal, or a buffered version of the transmit signal. An arrangement of switches 729A, 729B selectably couple the differential baseband or intermediate frequency signals to the mixer's output terminals. ADC 704 digitizes the baseband signal for further digital signal processing, which determines distance and direction information for the reflectors producing the receive signal. Filters may be provided within the signal multipliers 728, within the ADC 704, or in an intermediate position, to block harmonics from the downconversion process.

Switches 729 may be, e.g., a mechanical switch or a switch implemented using transistors that convey baseband or intermediate frequency signals with minimal attenuation or distortion. Because the spectrum of these signals excludes high frequency content, a traditional transistor-based switch or multiplexer can be employed. Metal oxide semiconductor field effect transistors are suitable for implementing such switches.

Figure 7C:
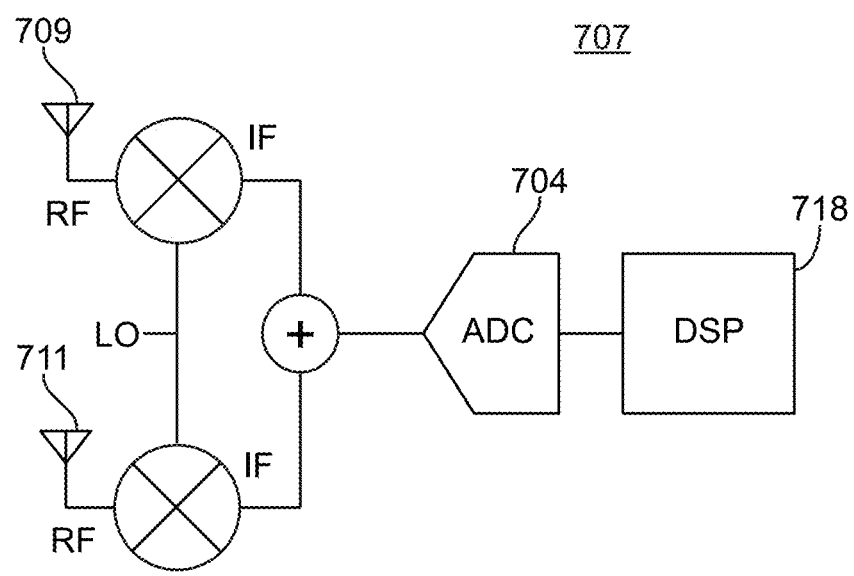
FIG. 7C is a schematic of an illustrative configuration for an antenna-sharing receiver.

FIG. 7C is a schematic of an illustrative configuration 707 for an antenna-sharing receiver using a hardware-efficient receiver topology which is herein termed "MIMO+". MIMO+ is a receiver architecture developed by ON Semiconductor (see related U.S. patent application Ser. No. 16/203,149, filed 2018 Nov. 28 and titled "Reconfigurable MIMO radar"), in which a pair of antennas, each coupled to a separate mixer, feed a single intermediate frequency (IF) chain (including an anti-aliasing filter (not shown) and ADC 704). A MIMO+ receiver (e.g., 707) can be configured to down convert and sample the signal received by one of the two antennas 709, 711 at a time, effectively doubling the receiver (RX) array aperture without having to double the number IF filters, ADCs, and digital links to the DSP unit (e.g., 718), thereby effectively doubling the number of transmitters in a TDM MIMO radar.

Examples of this disclosure enable a receiver to accept a combined signal from the receive antennas while maintaining the receiver's ability to distinguish between the signals obtained by each receive antenna. In at least some examples, this phase modulation is applied to received antenna signals in order to distinguish between received antenna signals.

Such phase modulation is different from the phase shifting by programmable phase shifters employed for receiver-side beamforming. Phased arrays can be electronically steered to scan for targets or to track targets. The configuration of a phased array to achieve a desired beam shape is called beamforming. There are two classes of beam forming techniques: Analog beamforming, and Digital beamforming.

Figure 7D:
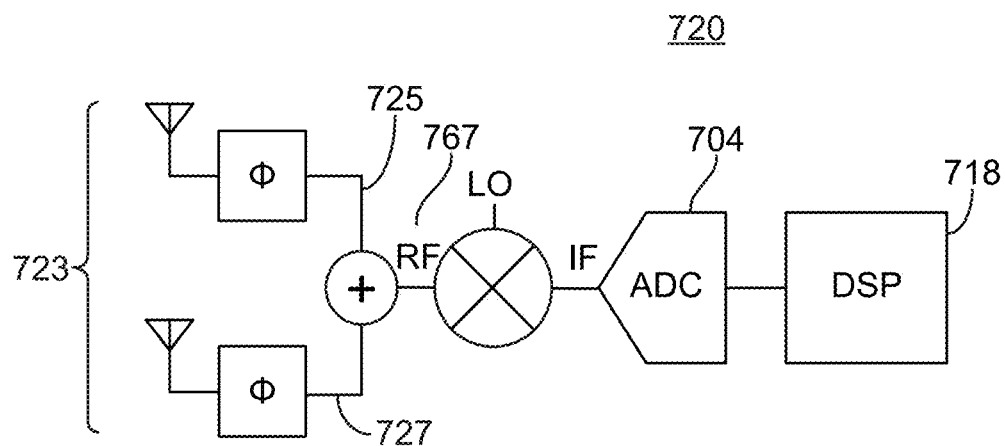
FIG. 7D is a schematic of an illustrative configuration for a multi-input receiver with analog beamforming in the radio frequency domain.

FIG. 7D is a schematic of an illustrative configuration 720 for a multi-input receiver with analog beamforming. An antenna array 723 is steered using configurable time delay or phase shifting elements in the RF path. The received signals 725, 727 from the different array elements are superimposed in the RF domain. The resultant signal 767 is then down converted, sampled, and processed by the DSP unit 718 downstream of the ADC 704.

Figure 7E:
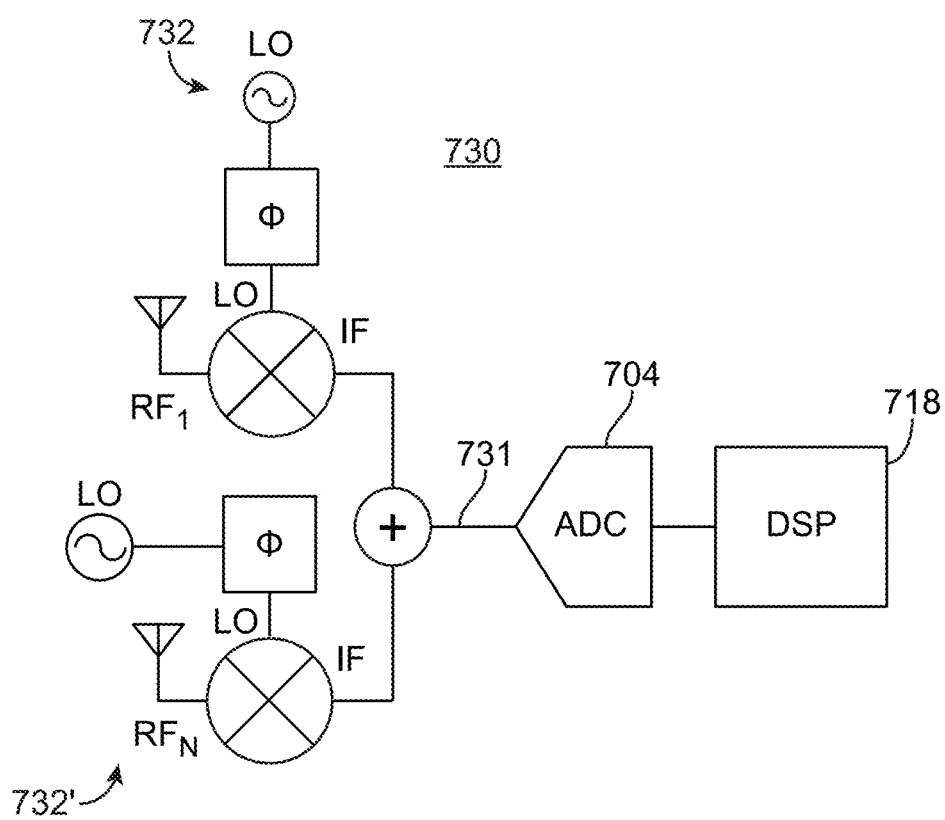
FIG. 7E is a schematic of an illustrative configuration for a multi-input receiver with digital beamforming in the intermediate frequency domain.

FIG. 7E is a schematic of another illustrative configuration 730 for a multi-input receiver with analog beamforming, in which time delay or phase shifter elements (not shown) are placed in the LO distribution network 732. The received signals from the different array elements are superimposed in the IF domain. The resultant signal 731 is then sampled and processed by the DSP unit 718 downstream of the ADC 704.

Figure 7F:
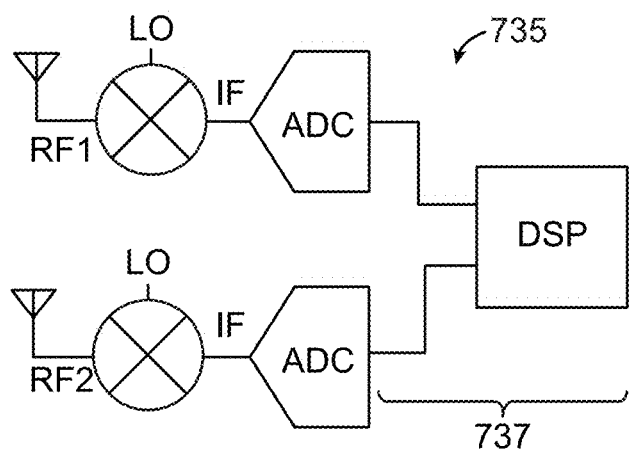
FIG. 7F is a schematic of an illustrative configuration for a multi-input receiver with digital beamforming.

FIG. 7F is a schematic of an illustrative configuration 735 for a multi-input receiver with digital beamforming. The signal from each array element is downconverted and sampled independently. Time delay and summation are applied in the digital domain 737. One advantage of digital beamforming is that an array may be steered in many directions simultaneously, allowing detection of several targets at once. The phase shifters (not shown) or time delays employed for beamforming in configurations 720 and 730 may be used to modulate the signal RF1, RF2 received from each antenna by orthogonal codes before the signals are summed and sampled. The received signals may then be recovered in the DSP unit 718 using a demodulation algorithm.

Figure 7G:
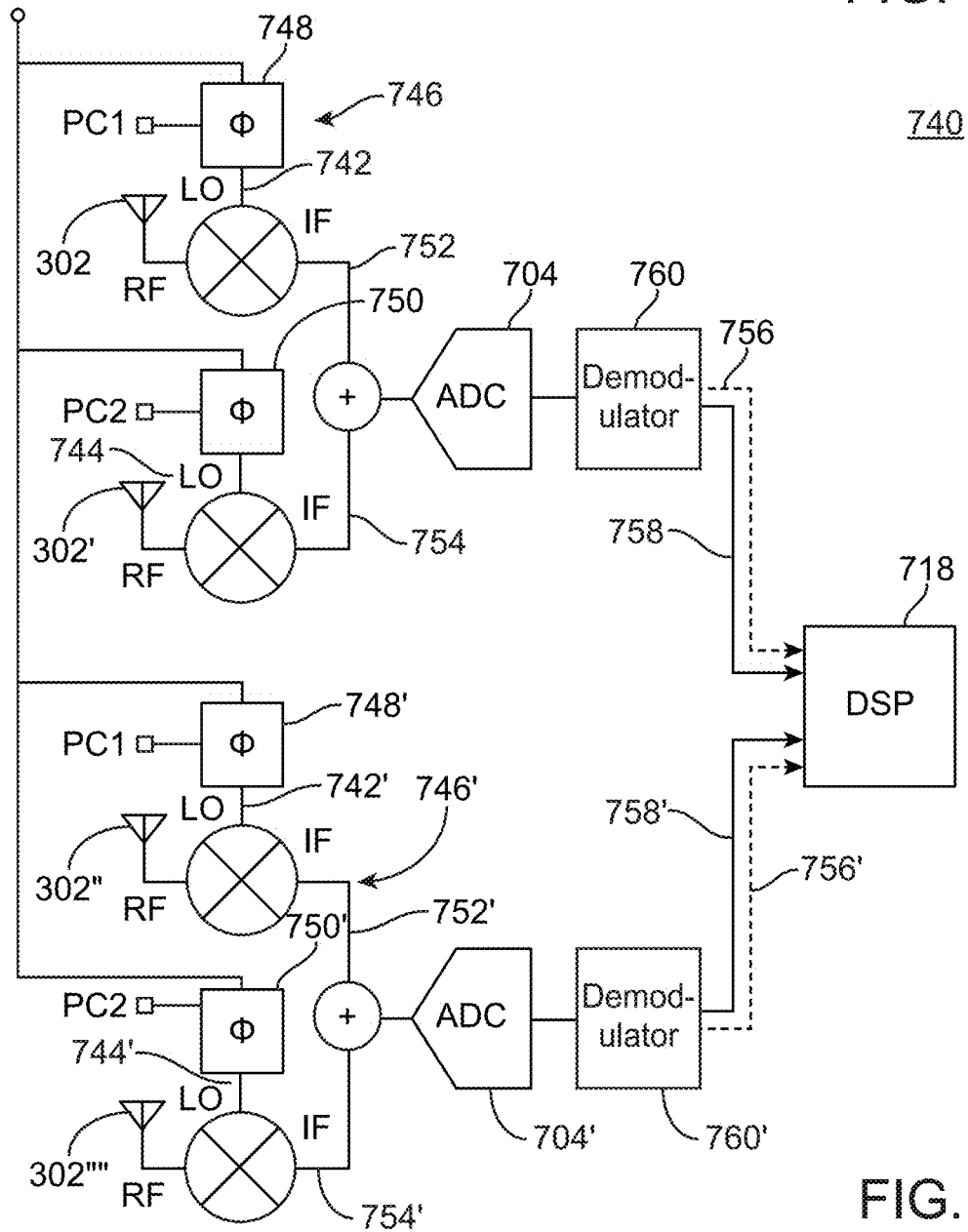
FIG. 7G is a schematic of an illustrative configuration for a multi-input digital beamforming receiver with antenna multiplexing.

FIG. 7G is a schematic of an illustrative configuration 740 for a multi-input digital beamforming receiver with antenna multiplexing. Phase shifters 748, 750 are placed at the LO inputs 742, 744 of each mixer pair 746 to modulate the received signals using orthogonal codes. The down converted IF signals are summed and sampled. The digital signals 756, 758 corresponding to the down converted IF signals 752, 754 (respectively) are then separated by a demodulator unit 760 or a demodulation algorithm in the DSP unit 718 so that each waveform can be associated with the antenna 302 from which it originates. In the digital beamforming array 740 of FIG. 7G, phase shifters 748, 750 are used as phase modulators and the mixer pairs 746 are used as MIMO+ mixer pairs. As shown, two (2) phase shifters/modulators 748, 748' receive a first phase code, PC1, and two (2) phase shifters/modulators 750, 750' receive a second phase code, PC2. As shown in FIG. 7G, the number of orthogonal codes is equal to the number of mixers that are connected to an ADC 704. The quantity of orthogonal codes for the configuration 740 of FIG. 7G is thus two (2). A mixer pair (e.g., 746) may be constructed using a low-noise, linear implementation of a MIMO+ mixer pair such as that shown in FIG. 9A, discussed below. In at least one example of this disclosure, a configuration enables (e.g., 740) operation of a MIMO+ receiver in CDMA mode, which doubles spatial resolution without degrading velocity measurement.

Figure 8:
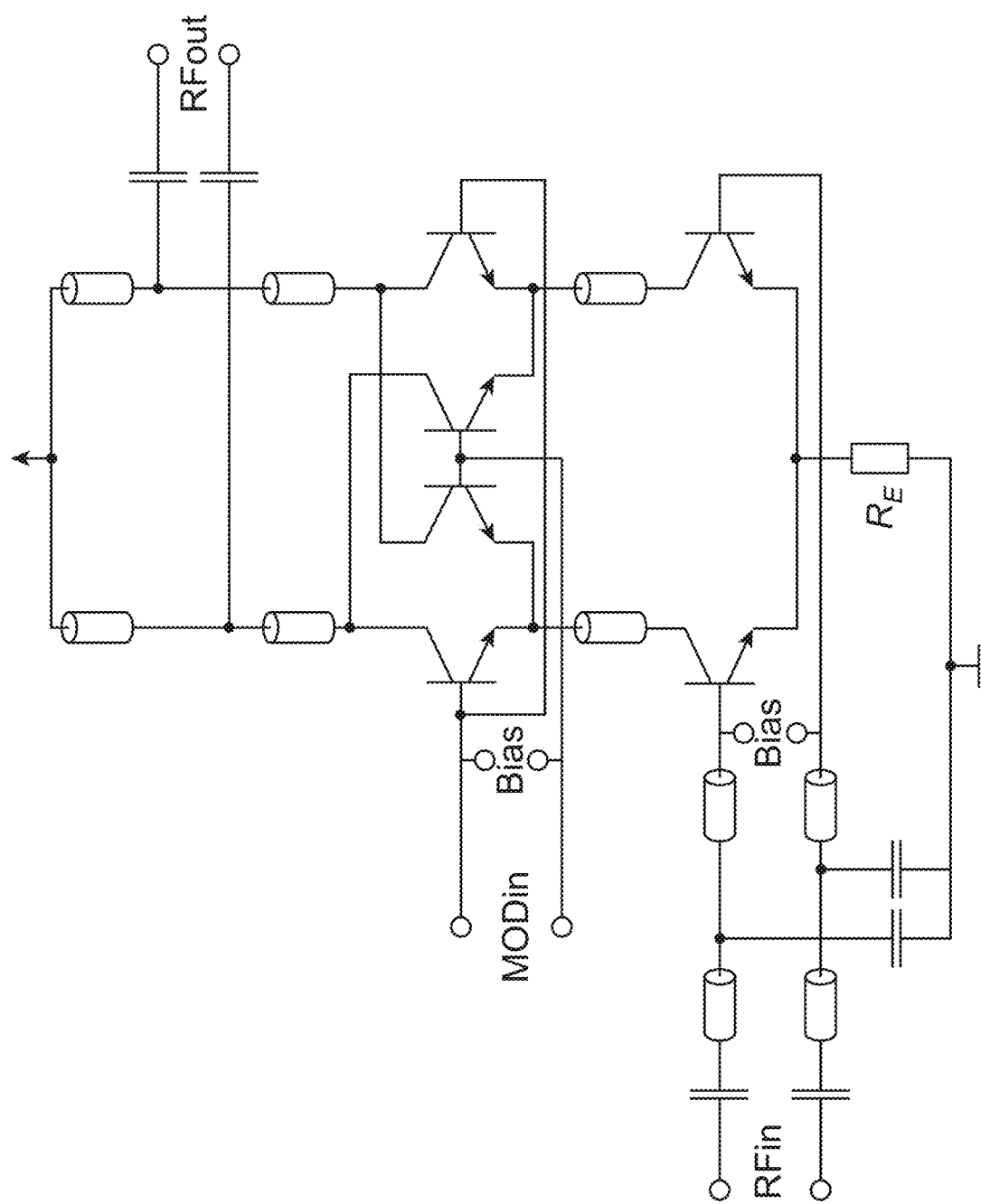
FIG. 8 is a schematic of an illustrative bipolar modulator suitable for radio frequency signals.

In at least one example of this disclosure, the phase shifters/modulators 748, 750 of the configuration 740 of FIG. 7G may be implemented as BPSK modulators. FIG. 8 is a schematic of a BPSK modulator which may be used to implement the phase shifters/modulators 748, 750 of the configuration 740.

Figure 9A:
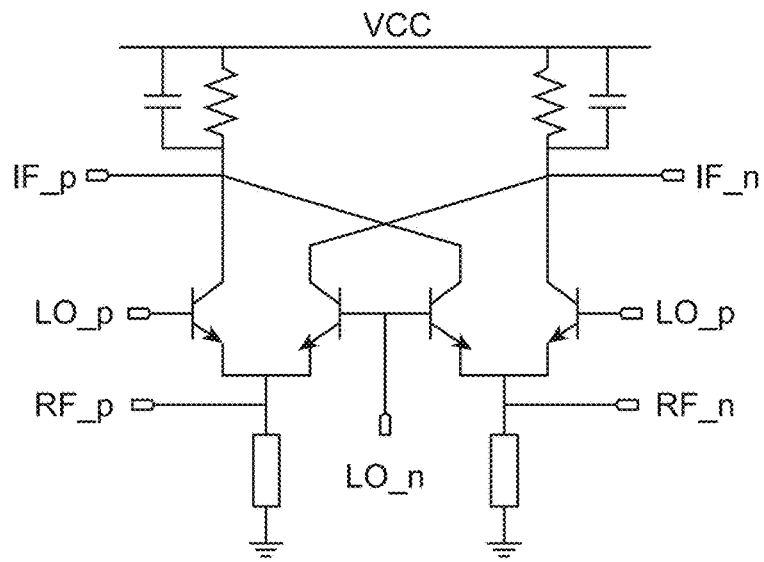
FIGS. 9A-9F are illustrative circuit examples of a multi-input downconversion mixer.

FIG. 9A. illustrates an example circuit which includes two semi-passive single-balanced mixers with combined outputs. Each single-balanced mixer may be enabled or disabled by driving or not driving it with an LO signal. The IF outputs are combined in the current domain.

Figure 9B:
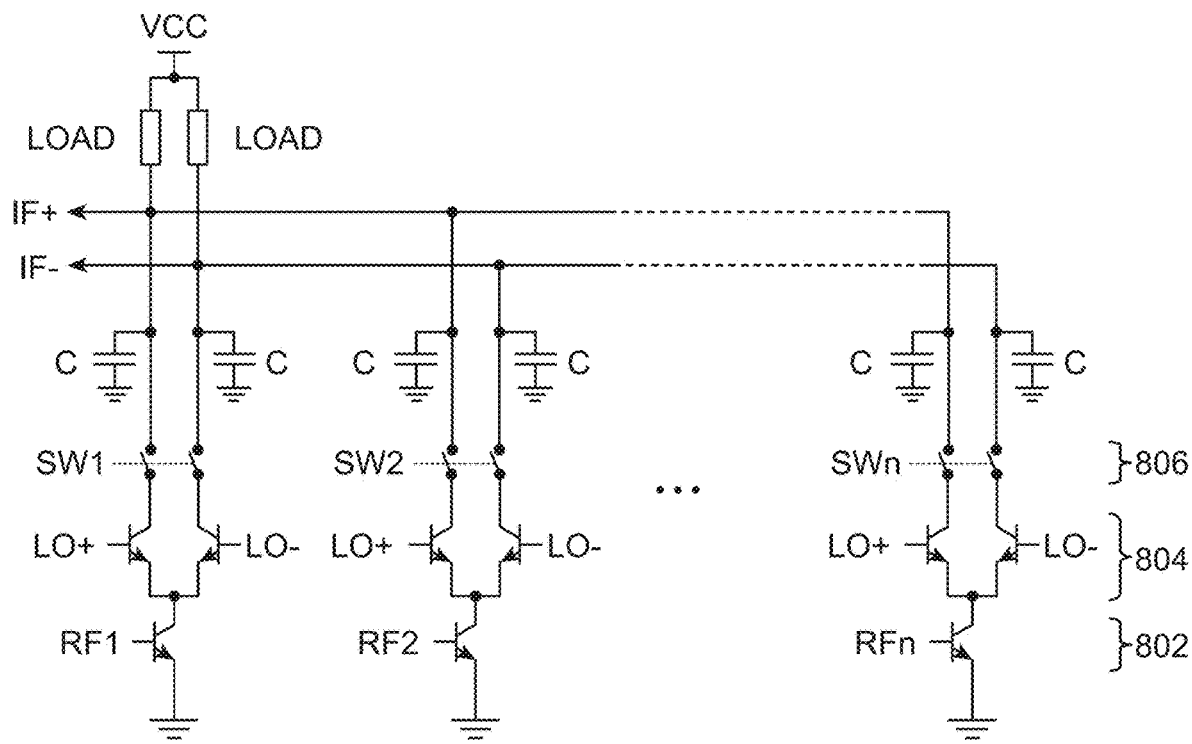

FIG. 9B shows an illustrative circuit implementation of a multi-input down conversion mixer (722). Each of multiple inputs RF1, RF2, ... RF$_N$, is coupled to the base or gate of a respective input transistor 802. The input transistors 802 are each coupled between ground (or another reference voltage) and the common node of a differential pair of transistors 804. A differential pair, also known as a "long tail" pair, is formed by two transistors having their emitters or sources connected to a common node to "compete" for current flow from the node, thereby producing amplification of the difference between signals applied to their bases or gates, shown in FIG. 9B as LO+ and LO−, representing a differential carrier signal from a local oscillator. The transistors may be bipolar junction transistors (BJTs) or metal oxide semiconductor field effect transistors (MOSFETs). The amplified difference appears between the collectors or drains of the two transistors. Because the current flow from the common node is modulated by the differential transistor pair, the signal between the collectors or drains of each differential pair 804 is the product of the respective input signal and the differential carrier signal.

A set of double pole single throw (DPST) switches 806 connect or disconnect the collectors or drains of differential pairs 804 to "intermediate frequency" output terminals IF+ and IF−, so that the output terminals convey the sum of the product signals from the connected differential pairs 804. (Often, only one of the differential pairs will be connected, providing a mechanism for switching between inputs.) Switches 806 may be mechanical, or transistor based. A load impedance LOAD may be provided to pull-up or otherwise bias the output terminals along with any connected differential pairs 804. In some contemplated examples, the load impedance is replaced by an active load composed of active devices. Capacitances are preferably coupled to each output terminal and may cooperate with the load impedances to filter high frequencies from the output signal. In particular, the capacitances may be sized to provide a cutoff frequency that suppresses the frequencies of the differential reference signal and the antenna input signals, enabling only the intermediate and/or baseband frequencies of the product signals to reach the output terminals.

In FIG. 9B, these capacitances are implemented as discrete capacitors C each coupled to one of the terminals of switches 806—a configuration which may improve isolation between the input signals. Isolation may be further improved by disabling the reference input signal LO+, LO− for any disconnected differential pairs. In any case, because the summing of signals occurs in the intermediate frequency domain rather than the radio frequency domain, the input signals are not unnecessarily loaded.

Though the reference input signal terminals are marked as "local oscillator" terminals and the output signal terminals are marked as "intermediate frequency" terminals, the reference input signal is not limited to just a carrier signal, and the output signal need not be an intermediate frequency signal. As previously mentioned, the reference input signal may be a modulated signal or a buffered version of the transmit signal, and the output signal may optionally be a baseband signal.

Figure 9C:
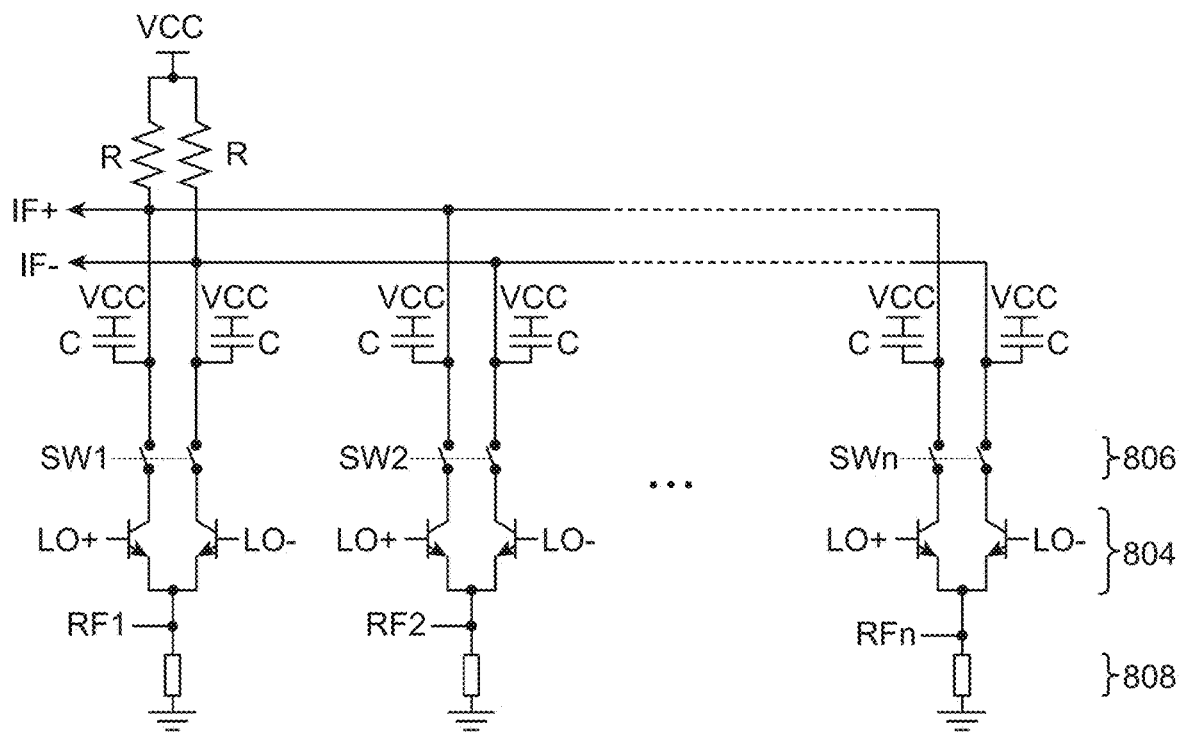

FIG. 9C shows another illustrative circuit implementation of a mixer (722). In this implementation, the input transistors 802 are replaced with impedances 808, and the input signals RF1-RFn directly drive the common node of the differential pairs 804. Impedances 808 may be current sources, high value resistors, large inductors, or quarter-wavelength transmission lines. The implementation of FIG. 9C shows the pull-up impedances as resistors R, and the capacitors C are shown coupled to voltage supply VCC rather than ground.

Figure 9D:
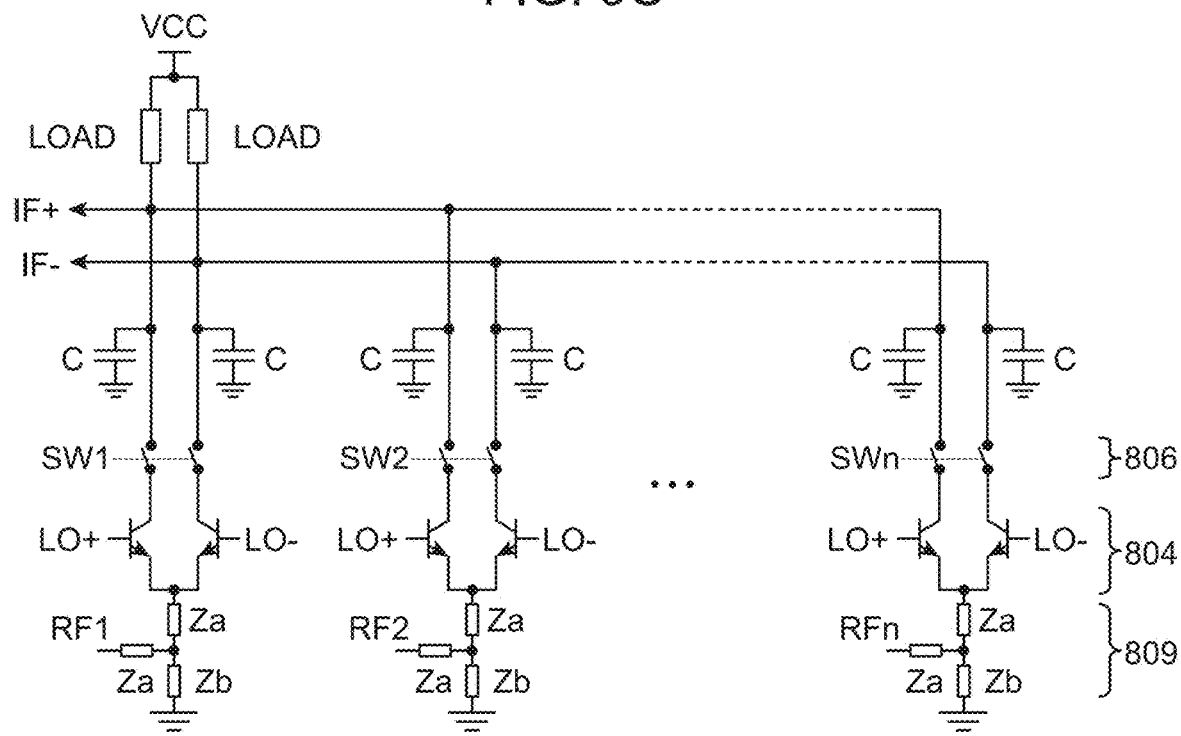

FIG. 9D shows yet another illustrative circuit implementation of a mixer (722). In this implementation, the input transistors 802 are replaced by a matching network 809 that may provide power or noise matching at the relevant RF frequencies. In the figure, the matching network couples the common nodes of the differential pairs to ground via two impedances Za, Zb in series, and couples a respective one of the input signals RF1-RFn via a third impedance Za to the intermediate node between the first two impedances Za, Zb. This configuration is expected to provide improved linearity relative to the configuration of FIG. 9C.

As mentioned above, the signal on the output terminals is a selected one of the product signals (or the sum of selected product signals) as determined by which of the differential pairs is/are connected. If it is desired to subtract one of the input signals, say RF1, from the rest, then its polarity can be reversed.

Figure 9E:
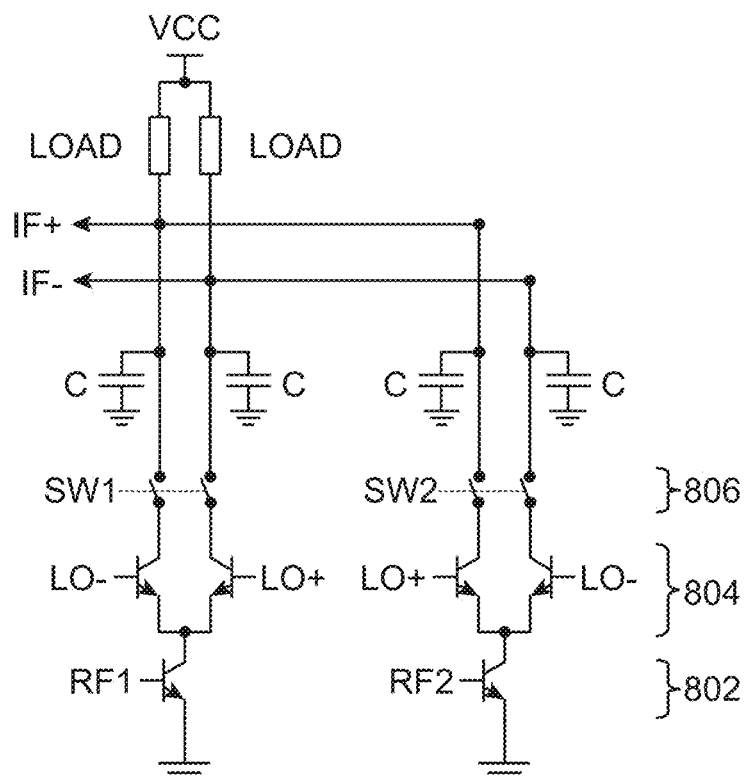

Alternatively, as shown in FIG. 9E, the reference signal inputs LO+ and LO− of each pair can be swapped. This enables the mixer to selectively downconvert: (1)+RF1 (2) −RF1; (2)+RF2; (3) −RF2; (4) RF1−RF2, and (4) RF2−RF1. This differential input option may be useful for a differential antenna input or an antenna input that has been converted to differential form by a balun or other means. In any case, the mixer's ability to handle single-ended and differential inputs increases flexibility. The required chip area for the circuit of FIG. 9E is substantially the same as that of a standard double-balanced mixer, with half the power consumption of the reference signal LO, switchability between inputs in the intermediate frequency domain, and improved isolation between inputs.

Figure 9F:
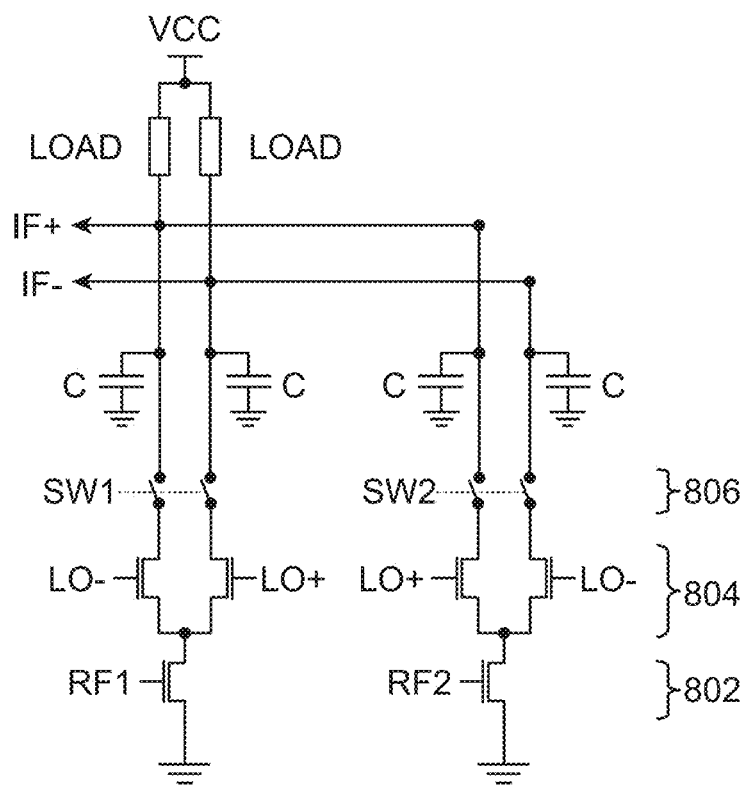

FIGS. 9A-9E have been drawn using the bipolar NPN symbol for each of the transistors, but it should be recognized that other transistor implementations are contemplated for use. By way of example, FIG. 9F shows the example of FIG. 9E revised to use N-channel MOSFETs for each of the transistors. The circuits can also be readily adapted to employ bipolar PNPs, P-channel MOSFETs, CMOS, and other known transistor implementations.

The proposed reconfigurable MIMO system approach connects several antennas to each receiver using, e.g., a switch. The various new antenna combinations created by using the additional antennas can, with suitable digital processing, improve the performance of imaging radar systems. Among other things, better spatial resolution, better range detection capabilities, and better power consumption can be achieved compared to existing radar solutions, and the principles disclosed herein may also be applicable to wireless communication systems (e.g., 5G). In the case of communications, the main purpose of the reconfigurable MIMO is to improve the communication capacity in multipath environments. In the case of radar systems, the reconfigurable MIMO approach can also provide improved performance in multipath environments, but perhaps more importantly it can improve angular resolution, multi-target tracking, and potentially provide multiple modes for increasing the detection range. More generally, the foregoing principles can be applied to any MIMO transducer array needing mixers to downconvert from radio frequencies (in especially radar or microwave frequencies) to intermediate or baseband. These and numerous other modifications, equivalents, and alternatives, will become apparent to those skilled in the art once the above disclosure is fully appreciated. It is intended that the following claims be interpreted to embrace all such modifications, equivalents, and alternatives where applicable.

What is claimed is:

1. A multi-antenna signal decoding method, comprising:
producing a first reference signal by modulating a first copy of an oscillation signal with a first coding pattern, using a first modulator;
producing one or more second reference signals by modulating, using one or more second modulators, one or more second copies of the oscillation signal with one or more second coding patterns orthogonal to the first coding pattern;
receiving a first antenna signal and the first reference signal at a first mixer;
producing, using the first mixer, a first down-converted signal based on the first antenna signal and the first reference signal;
receiving, at one or more second mixers, one or more second antenna signals and the one or more second reference signals;
producing, using the one or more second mixers, one or more second down-converted signals based on the one or more second antenna signals and the one or more second reference signals;
converting, using an analog-to-digital converter, a summation signal corresponding to a sum of the first down-converted signal and the one or more second down-converted signals, into a digital receive-signal; and
extracting, at a processor, a plurality of digital signals from the digital receive-signal, wherein each of the plurality of digital signals corresponds to one of the first antenna signal and the one or more second antenna signals.

2. The multi-antenna signal decoding method of claim 1, wherein the oscillation signal is a differential signal.

3. The multi-antenna signal decoding method of claim 1, wherein the first modulator comprises a first phase modulator, and at least one of the one or more second modulators comprise a second phase modulator.

4. The multi-antenna signal decoding method of claim 3, wherein the first phase modulator and the second phase modulator are binary phase-shift keying modulators.

5. The multi-antenna signal decoding method of claim 1, wherein the first coding pattern and the one or more second coding patterns comprise six-bit, sixty-four phase coding patterns.

6. The multi-antenna signal decoding method of claim 1, further comprising:
producing the summation signal by summing the first down-converted signal and the one or more second down-converted signals, using a summation circuit; and
minimizing aliasing in the summation signal using an anti-aliasing filter.

7. A multi-antenna digital beamforming transceiver, comprising:
a first modulator configured to produce a first reference signal by modulating a first copy of an oscillation signal with a first coding pattern;
one or more second modulators, the one or more second modulators configured to produce one or more second reference signals by modulating one or more second copies of the oscillation signal with one or more second coding patterns orthogonal to the first coding pattern;
a first mixer configured to receive a first antenna signal and the first reference signal, and produce a first down-converted signal based on the first antenna signal and the first reference signal;
one or more second mixers, the one or more second mixers configured to receive one or more second antenna signals and the one or more second reference signals, and produce one or more second down-converted signals based on the one or more second antenna signals and the one or more second reference signals;
an analog-to-digital converter configured to convert a summation signal corresponding to a sum of the first down-converted signal and the one or more second down-converted signals, into a digital receive-signal; and
a processor coupled to the analog-to-digital converter and configured to extract a plurality of digital signals from the digital receive-signal, wherein each of the plurality of digital signals corresponds to one of the first antenna signal and the one or more second antenna signals, before or after additional signal processing operations are applied.

8. The multi-antenna digital beamforming transceiver of claim 7, wherein the oscillation signal is a differential signal.

9. The multi-antenna digital beamforming transceiver of claim 7, wherein the first modulator comprises a first phase modulator, and each one of the one or more second modulators comprises a second phase modulator.

10. The multi-antenna digital beamforming transceiver of claim 9, wherein the first phase modulator and the second phase modulator are binary phase-shift keying modulators.

11. The multi-antenna digital beamforming transceiver of claim 7, wherein the first coding pattern and the one or more second coding patterns comprise six-bit, sixty-four phase coding patterns.

12. The multi-antenna digital beamforming transceiver of claim 7, wherein the processor is a digital signal processor.

13. The multi-antenna digital beamforming transceiver of claim 7, further comprising:
a summation circuit configured to produce the summation signal by summing the first down-converted signal and the one or more second down-converted signals; and
an anti-aliasing filter coupling the summation circuit to the analog-to-digital converter and configured to minimize aliasing in the summation signal.

14. The multi-antenna digital beamforming transceiver of claim 7, wherein the multi-antenna digital beamforming transceiver resides on a single chip.

15. A non-transitory computer readable medium storing instructions executable by a processor, the instructions comprising instructions to:
produce a first reference signal by modulating a first copy of an oscillation signal with a first coding pattern, using a first modulator;

produce one or more second reference signals by modulating one or more second copies of the oscillation signal with one or more second coding patterns orthogonal to the first coding pattern, using one or more second modulators;

receive, using a first mixer, a first antenna signal and the first reference signal;

produce, using the first mixer, a first down-converted signal based on the first antenna signal and the first reference signal;

receive, using one or more second mixers, one or more second antenna signals and the one or more second reference signals;

produce, using the one or more second mixers, one or more second down-converted signals based on the one or more second antenna signals and the one or more second reference signals;

receive, at the processor, a digital receive-signal from an analog-to-digital converter, the digital receive-signal corresponding to a sum of the first down-converted signal and the one or more second down-converted signals, into a digital receive-signal; and extract a plurality of digital signals from the digital receive-signal, wherein each of the plurality of digital signals corresponds to one of the first antenna signal and the one or more second antenna signal.

16. The non-transitory computer readable medium claim 15, wherein the first coding pattern and the one or more second coding patterns comprise six-bit, sixty-four phase coding patterns.

17. The non-transitory computer readable medium of claim 15,
wherein the instructions further comprise instructions to:
produce, using a summation circuit, the digital receive-signal by summing the first down-converted signal and the one or more second down-converted signals; and
minimize, using an anti-aliasing filter, aliasing in the digital receive-signal.

* * * * *